(12) United States Patent
Singh

(10) Patent No.: US 8,170,150 B2
(45) Date of Patent: May 1, 2012

(54) DIGITALLY CONTROLLED PHASE INTERPOLATOR CIRCUIT

(75) Inventor: Ullas Singh, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 590 days.

(21) Appl. No.: 12/052,946

(22) Filed: Mar. 21, 2008

(65) Prior Publication Data

US 2009/0238307 A1 Sep. 24, 2009

(51) Int. Cl.
*H03D 3/22* (2006.01)
(52) U.S. Cl. .................................. 375/332; 330/253
(58) Field of Classification Search .................. 327/156, 327/165; 330/147, 253, 257, 260; 375/324, 375/328, 332, 365, 371
See application file for complete search history.

(56) References Cited

U.S. PATENT DOCUMENTS

| | | | | |
|---|---|---|---|---|
| 4,574,203 A * | 3/1986 | Baba | | 327/291 |
| 5,313,172 A * | 5/1994 | Vagher | | 330/254 |
| 6,492,924 B2 * | 12/2002 | Copley et al. | | 341/139 |
| 7,187,727 B2 * | 3/2007 | Saeki | | 375/327 |
| 7,283,082 B1 * | 10/2007 | Kuyel | | 341/155 |
| 2005/0093629 A1 * | 5/2005 | Nishimura et al. | | 330/253 |

OTHER PUBLICATIONS

Bulzacchelli et al ("A 10-Gb/s 5-Tap DFE/4-Tap FFE Transceiver in 90-nm CMOS Technology", IEEE Journal of Solid State Circuits, vol. 41, No. 12, Dec. 2006).*

* cited by examiner

*Primary Examiner* — David C. Payne
*Assistant Examiner* — Leon-Viet Q Nguyen
(74) *Attorney, Agent, or Firm* — Garlick & Markison; Shayne X. Short

(57) ABSTRACT

Digitally controlled phase interpolator circuit. A phase selection control word undergoes decoding to generate a switch control word. The phase selection control word includes 2 quadrant indicating bits and phase interpolating bits for a 4 clock scheme (e.g., 4 clocks having phases 0°, 90°, 180°, and 270°). Such a phase selection control word could includes 3 sector indicating bits and phase interpolating bits for an 8 clock scheme (e.g., 8 clocks having phases 0°, 45°, 90°, 135°, 180°, 225°, 270°, and 315°). The gates of a number of differential pairs of transistors receive the various clock signals. A number of switching circuits direct current from corresponding current sources/supplies to coupled sources of the differential pairs of transistors, and an output clock is taken from coupled drains of the differential pairs of transistors. One or more current sources/supplies can be implemented to provide continuous current (e.g., in an always on manner) to the differential pairs of transistors.

20 Claims, 12 Drawing Sheets

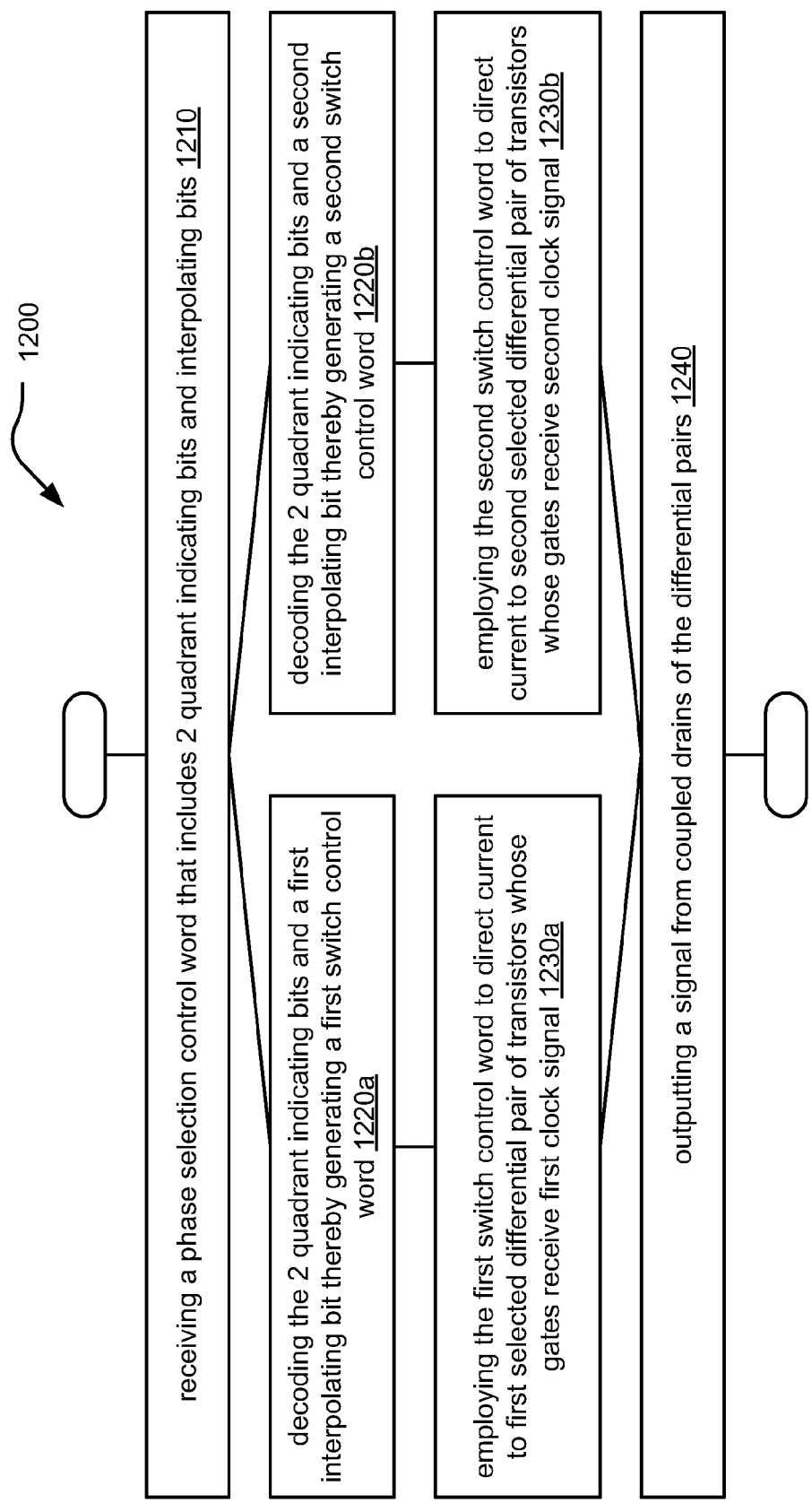

DIGITALLY CONTROLLED PHASE INTERPOLATOR CIRCUIT

BACKGROUND OF THE INVENTION

1. Technical Field of the Invention

The invention relates generally to communication systems; and, more particularly, it relates to phase interpolating to generate signals within such communication systems.

2. Description of Related Art

Data communication systems have been under continual development for many years. Sometimes within such communication systems, there is a need to perform phase interpolation of signals (e.g., by changing the phase of such signals or by generating a signal having a particular phase). For example, within a wide variety of applications (e.g., serializers, de-serializers, and/or other communication devices, etc.), there may be a need to generate a signal having a desired phase.

Traditional, prior art embodiments of N step phase rotators employ control signals including N bits. As N (or the number of required phase interpolators) increases, the necessary control signal routing and congestion also increases. As this number increases, the digital to analog (I/F) interfacing becomes a challenging design issue.

In addition, the bandwidth limitation of typical transmission media creates Inter-Symbol Interference (ISI) which limits the receiver capability to correctly detect the transmitted data. To address this problem, some prior art approaches have employed equalizers that are often integrated into such communication receivers.

A digital signal processor (DSP)-based equalizer is usually the preferred choice in the prior art because of its increased flexibility and better performance compared to an analog implementation. To enable such equalizers, a high speed analog-to-digital converter (ADC) is required. Time-interleaved ADCs have become the architecture of choice in the prior art for achieving such high conversion.

In time-interleaved ADCs, several sub-converter channels are operated in parallel such that each channel is running at a lower sampling rate than the rate of the incoming signal. One of the critical issues for such an implementation is to deal properly with the errors due to timing mismatch between the multiple channels performing digital sampling. A continuous scheme, based on multiple phase interpolators (PI) to adjust the sampling time of each ADC independently can correct for this timing mismatch. An approach employing a prior art phase interpolator is described below.

FIG. 2 illustrates an embodiment of a prior art phase interpolator 200. This diagram shows the block diagram of a traditional/prior art 4 stage time-interleaved ADC with four phase interpolators (PIs). The PIs receive clocks with different phases (an in-phase clock, clkI, and a quadrature clock, clkQ) and generate the main clock (e.g., of the output signal) which is the weighted sum of the input clocks determined by the value of pictrl. The number of bits needed is determined by the resolution (e.g., step size) necessary to minimize the dithering jitter in this example is 256 bits.

In this diagram, a 256 bit control signal is generated by each corresponding PI controller (e.g., depicted by digital control blocks) and fed directly to the corresponding PI. For a 4 stage time interleaved ADC, 1024 (=256×4) pictrl control lines are required. Such large number of lines increases the silicon area/real estate of a communication device and creates a significant number of problematic issues at the digital/analog interface. Also, any unwanted glitches may undesirably, and unpredictably, change the output phase.

This prior art approach to perform phase interpolation inherently includes a very large control word (e.g., 256 bits in this embodiment). This can consequently lead to significant congestion and consumptive of real estate within this prior art approach.

FIG. 3 illustrates an embodiment of a prior art phase interpolator 300. To reduce the number of control lines at the digital-analog interface (I/F), a corresponding decoder can be implemented in the analog domain as shown in the diagram for each corresponding phase interpolator (PI). In this approach, there are two signals (e.g., up/down signals) employed per PI at the digital interface. It is noted, however, that the up/down signals need to be sampled before each corresponding decoder. Since the frequency of the sampling clock (ctrlclk) is much less than high-speed clock input, the latency of the clock recovery (CR) loop increases, thereby increasing jitter peaking.

As can be seen when considering the prior art scheme, there is a great deal of control signaling and routing therein. There exists a need in the art a better means by which phase interpolators may be implemented.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 12 illustrates an embodiment of a method for generated a phase interpolated signal.

DETAILED DESCRIPTION OF THE INVENTION

Figure 1:
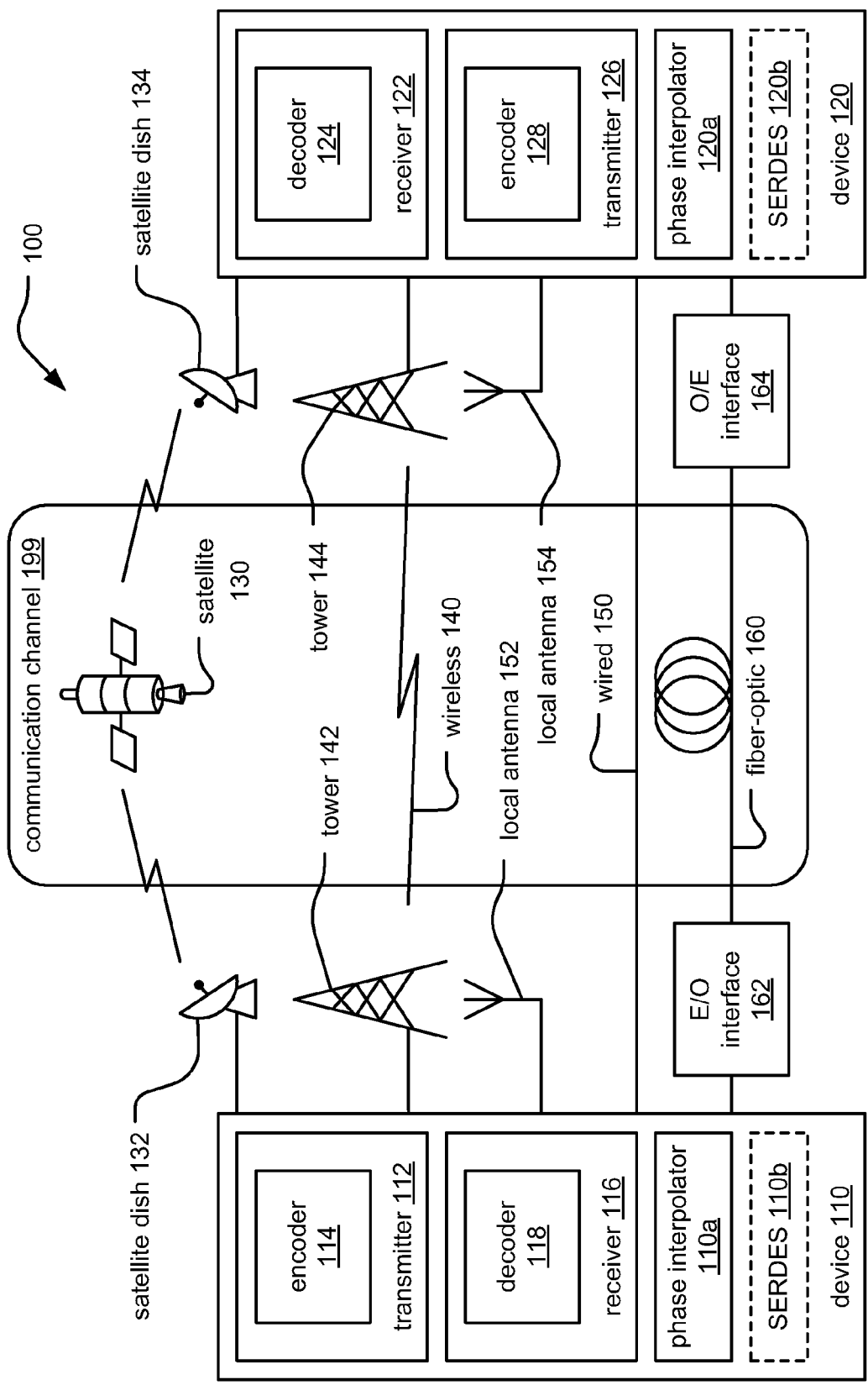
FIG. 1 illustrates an embodiment of a communication system.

A novel approach is presented herein by which a signal may be generated having any desired phase in a much less congested manner than performed within prior art schemes. The novel digitally controlled phase interpolator circuit has improved architecture and circuit performance when compared to the prior art schemes.

To generate any desired phase within constraints of a step size of a particular embodiment, interpolation is performed by taking clocks having different phases and generating an output clock signal which is a weighted sum of the input clocks. The control signaling employed in accordance with the novel approach presented is much more efficient than prior art approaches.

The number of control signals provided to each phase interpolator (PI) is significantly reduced when compared to the prior art schemes. Instead of employing a very large number of control signals as typically employed within the prior art, one embodiment of the novel scheme presented herein employs a much smaller phase selection control word that undergoes decoding. To reduce the number of control signals at the digital to analog interface (I/F), the decoder is implemented to receive digital control signals. The digital control signals are then output from the decoders and provided to the corresponding PIs. Generally speaking, the novel approaches provided herein enable to use of a significantly reduced amount of control signals (and/or bits). The novel phase interpolator presented herein requires fewer control lines (75% less compared to the prior art/conventional approach) while providing the same output phase resolution.

This significantly reduces the analog/digital interface complexity. Also a simple glitch free decoder is used at the interface, instead of a retimer in the prior art scheme operating at a low clock frequency. This also significantly reduces the latency of clock recovery (CR) loop thereby improving the jitter performance. The decoders employed ensure glitch-less operation. Two quadrant indicating bits and phase interpolating bits compose each phase selection control word. The phase interpolating bits may be considered as 'pictrl' bits in many of the novel embodiments depicted herein. Each phase selection control word, that includes these two quadrant indicating bits and phase interpolating bits, undergoes decoding to generate 4 control signals to control the digital to analog converter (DAC) current source/supply for a corresponding PI. The size of one of these decoders can be relatively very small, and it may be incorporated into each switched DAC current source/supply.

In addition, the novel approach for phase interpolation presented herein includes using a number of 'always on' current supplies to provide continuous current to certain elements within the overall architecture. For example, some embodiments employ a number of differential pairs of transistors (e.g., n-channel and/or p-channel metal oxide semiconductor field-effect transistors (N-MOSFETs and/or P-MOSFETs), n-channel and/or p-channel field-effect transistors, and/or any other desired type of switching technology), and the implementation of always on current supplies ensures that these differential pairs of transistors have improved linearity, reduced/faster settling time (e.g., operates faster since always on), and generally provide improved accuracy and a better phase response time of the PIs. By providing this current bias to the selected components, the need for charging up and turning on that component is obviated thereby ensuring much faster operation. The always on digital-to-analog (DAC) current cells provide for improved linearity and phase change response time of the PI.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber (e.g., optical fiber), copper, and/or other types of media as well.

FIG. 1 is a diagram illustrating an embodiment of a communication system 100.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/0) interface 162 and optical to electrical (O/E) interface 164)). In addition, more than one type of media may be implemented and interfaced together thereby forming the communication channel 199.

In addition, more than one type of media may be implemented and interfaced together thereby forming the communication channel 199. It is noted also that either one of both of the communication device 110 and the communication device 120 can include a hard disk drive (HDD) (or be coupled to a HDD).

It is also noted that any such communication device that is itself a serializer or de-serializer, or includes functionality to perform serialization or de-serialization can include a phase interpolator in accordance with any of the embodiments and/or aspects described herein. For example, the communication device 110 can include a serializer or de-serializer (SERDES) 110b, and the communication device 120 can include a SERDES 120b.

Moreover, either one of both of the communication device 110 and the communication device 120 can include a phase interpolator in accordance with any of the embodiments and/or aspects described herein. For example, the communication device 110 can include a phase interpolator 110a, and the communication device 120 can include a phase interpolator 120a.

The signals employed within this embodiment of a communication system 100 can be of any variety of types of signals, including uncoded signals, Reed-Solomon (RS) coded signals, LDPC (Low Density Parity Check) coded signal, turbo coded signals, turbo trellis coded modulation (TTCM), or coded signal generated using some other error correction coding (ECC).

Also, any of a very wide variety of applications that perform transferring of signals from one location to another (e.g., including from a first location to a HDD, or from the HDD to another location) can benefit from various aspects of the invention, including any of those types of communication devices and/or communication systems depicted in FIG. 1. Moreover, any other types of devices, methods, and applications that employ a phase interpolator or perform processing of a signal in accordance with phase interpolation can also benefit from various aspects of the invention.

Such a phase interpolator 110a or a phase interpolator 120a, or any embodiment of a phase interpolator in accordance with certain aspects described herein, can be implemented anywhere within a device where a signal having a particular phase is employed. For example, in some applications, many instantiations of an element are operated in parallel (e.g., an array of analog to digital converters (ADCs)). It may be desirable to ensure that all of these ADCs operate synchronously with one another. In such a case, one or more phase interpolators could be employed to ensure that signals being provided to the parallel-implemented ADCs are all in phase with one another. A number of parallel-implemented phase rotators could process those signals (e.g., being sampled by the ADCs) to ensure that they are all in proper phase with one another.

Another application may include a device that performs serialization and/or de-serialization (e.g., SERDES as described above), multiplexing and/or de-multiplexing in which multiple signals need to be processed together and it is desirable that they are all in phase with one another. Again, a number of parallel-implemented phase rotators could process those signals (e.g., undergoing serialization and/or de-serialization, multiplexing and/or de-multiplexing) to ensure that they are all in proper phase with one another.

Generally speaking, such a phase interpolator can be employed within any device in which a signal having a particular phase is desired.

Figure 2:
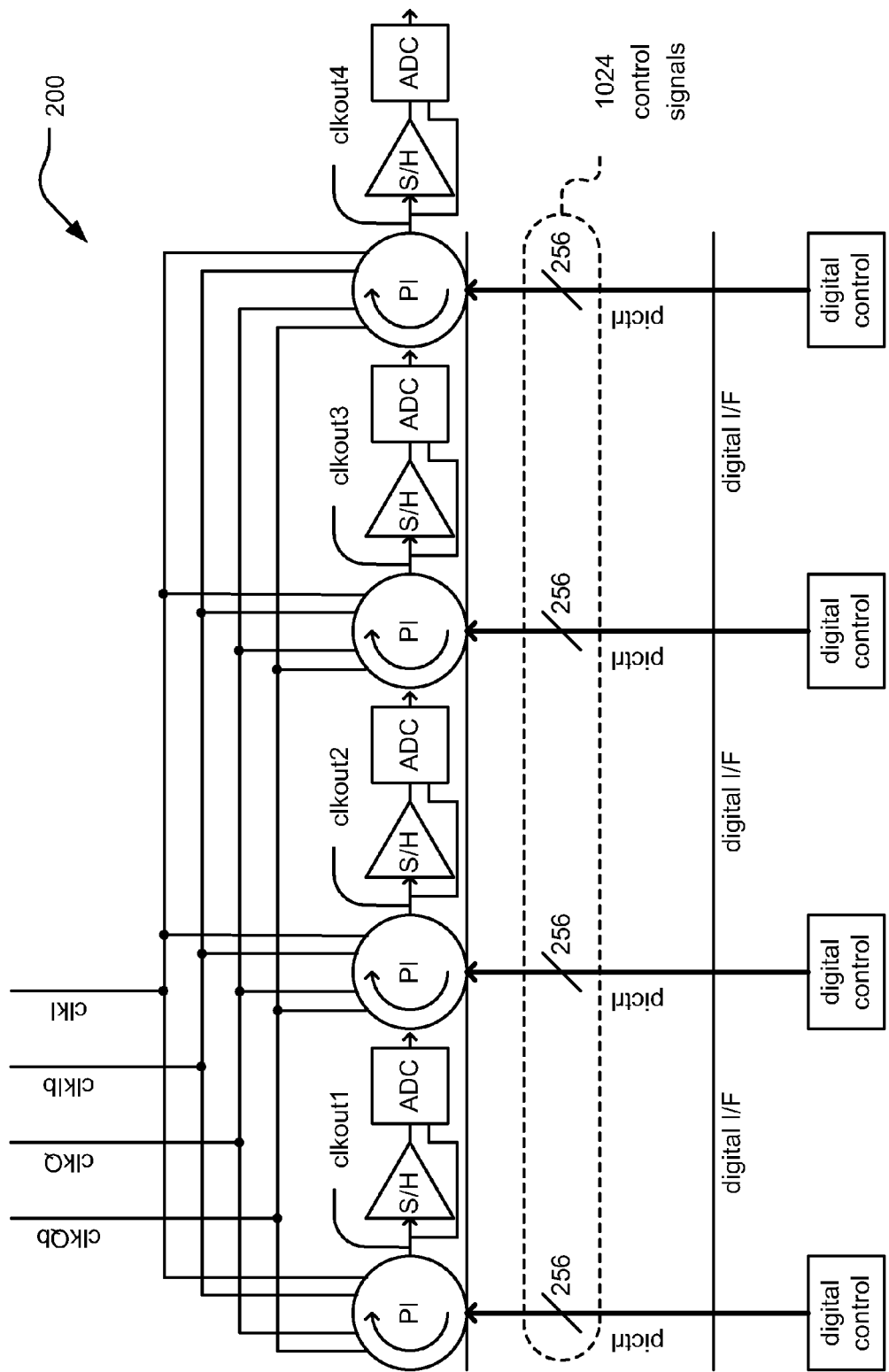
FIG. 2 illustrates an embodiment of a prior art phase interpolator.
Figure 3:
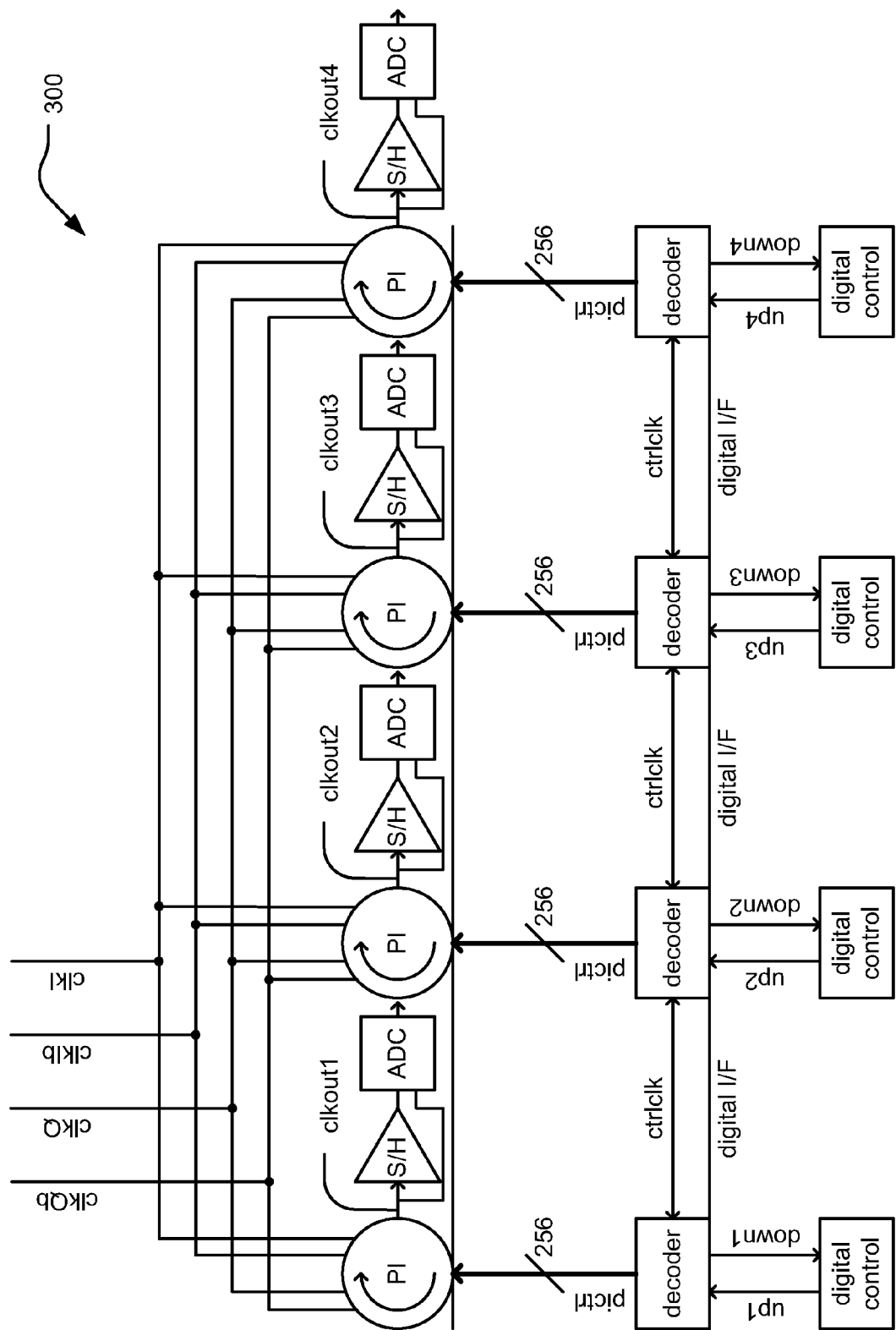
FIG. 3 illustrates an embodiment of a prior art phase interpolator.

For more detailed description of the prior art embodiments of FIG. 2 and FIG. 3, the reader is directed to the "DESCRIPTION OF RELATED ART" section herein.

FIG. 2 illustrates an embodiment of a prior art phase interpolator 200.

FIG. 3 illustrates an embodiment of a prior art phase interpolator 300.

Figure 4:
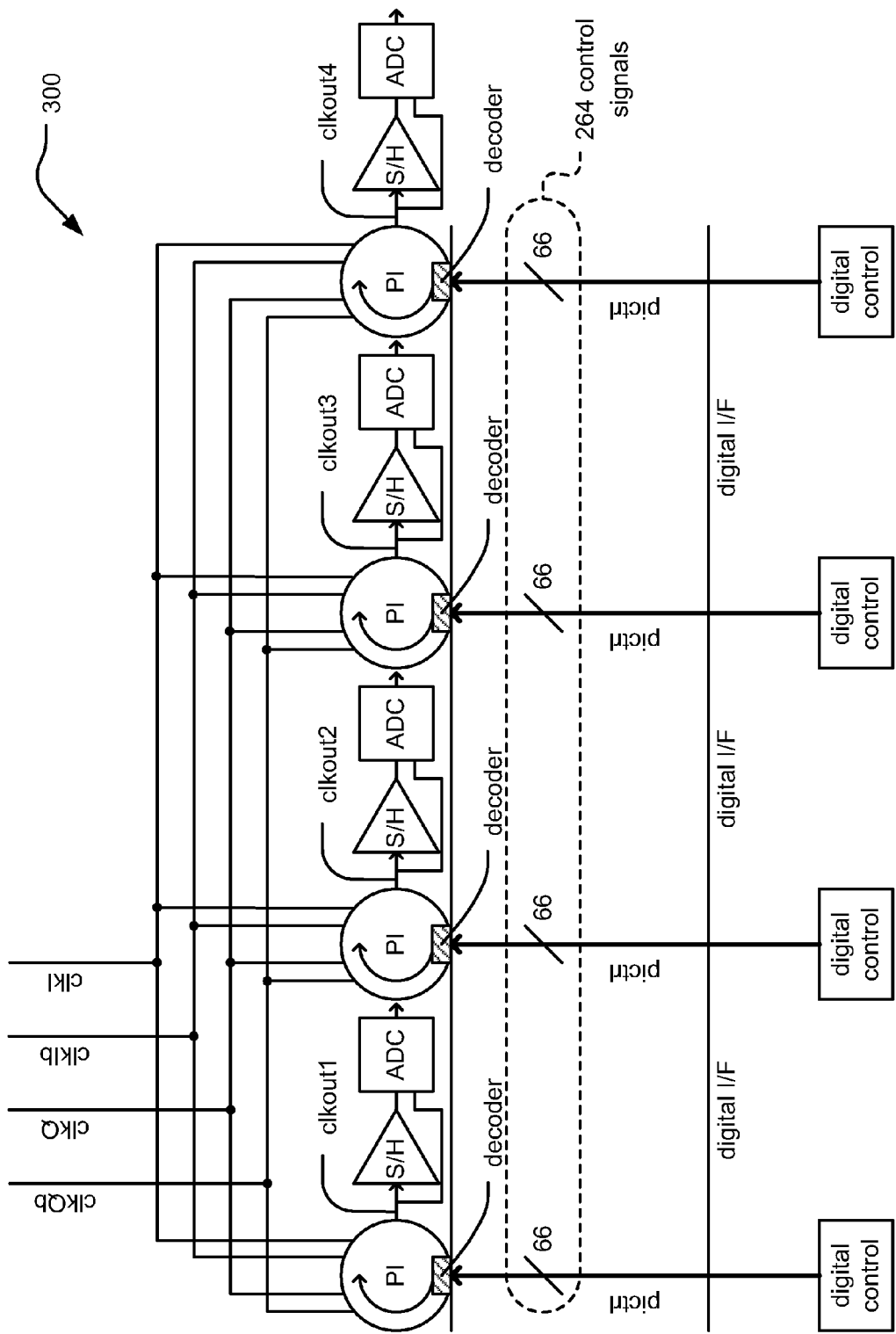
FIG. 4 illustrates an embodiment of a phase interpolator.

FIG. 4 illustrates an embodiment of a phase interpolator 400.

When comparing the novel approach of this diagram to the prior art phase interpolator 200 of FIG. 2 and the prior art phase interpolator 300 of FIG. 3, it can be seen that there is a significant reduction in the number of control lines, routing, and congestion.

Significantly reduced digital control is provided to each respective phase interpolator (PI) in this embodiment.

The following Table 1 compares the control signals employed when using the novel phase interpolator scheme presented herein to the prior art scheme.

The first four columns of the Table 1 show the prior art decoding scheme used when employing a conventional PI.

A 32 bit control word has been assumed in this example. The reader is reminded that the principles presented herein can be extended to different sized prior art control word as well, and the savings in congestion, real estate, complexity, etc. will be even greater when larger sized prior art control words are used.

Depending on the control bits provided to it, each respective PI is implemented to perform decoding of those control bits and then is able to perform interpolation using two clocks (e.g., two of the clocks having 0°, 90°, 180°, or 270°).

The following observation can be made about this prior art control signaling scheme:

a. Between 0° and 90°, only the bits pictrl1<15:0> are changing.

b. Between 0° and 90°, the bits pictrl1<15:8> have the opposite polarity compared to the bits pictrl1<7:0>.

c. The same is true for phase changes between 90° and 180°, 180° and 270°, and 270° and 0°/360°.

Significant improvement to the prior art control signaling scheme is presented within the novel approach herein by the following changes:

d. The first 2 bits may be viewed as being quadrant indicating bits, (pictrl2<9:8>), and they are employed to identify the quadrant boundaries that will be used to interpolate to generate a phase within that particular quadrant (e.g., use the clock signals corresponding to the quadrant boundaries of 0° and 90° to generate all phases in between 0° and 90°, use the quadrant boundaries of 90° and 180° to generate all phases in between 90° and 180°, use the quadrant boundaries of 180° and 270° to generate all phases in between 280° and 270°, and use the quadrant boundaries of 270° and 0°/360° to generate all phases in between 270° and 0°/360°).

e. The remaining 8 bits may be viewed as being phase interpolating bits, (pictrl2<7:0>), and those phase interpolating bits and their opposite polarity are employed to interpolate between the various quadrant boundaries as shown in the last column of the Table 1 (e.g., pictrl2<9:0> under column heading NOVEL SCHEME).

f. When comparing the prior art embodiment of FIG. 2 to the novel embodiment of FIG. 4, the total control bits required in the novel scheme is now only 10 bits (2 of which are quadrant indicating bits, and 8 of which are phase interpolating bits) as compared to 32 bits in the prior art scheme. This improvement is very significant for the case that compares the prior art embodiment of FIG. 2 to the novel embodiment of FIG. 4, and such an improvement would be even more significant for a prior art embodiment employing even more control signals. As shown in prior art FIG. 2, 1024 control signals [e.g., 1024=256×4=(32×8)×4)] are needed in such a prior art embodiment, and only 264 control signals [e.g., 264=(64 phase interpolating bits×4)+(2 quadrant indicating bits×4)] are required for the novel scheme of FIG. 4. It is noted that the 2 quadrant indicating bits are provided to each of the decoders/PIs (e.g., see the embodiment of FIG. 8 as one example showing such functionality).

TABLE 1 comparing novel phase interpolator scheme to prior art

| prior art scheme | | | | output | NOVEL SCHEME |
| --- | --- | --- | --- | --- | --- |
| pictrl1<31:24> | pictrl1<23:16> | pictrl1<15:8> | pictrl1<7:0> | phase | pictrl2<9:0> |
| 00000001 | 00000000 | 00000000 | 11111110 | | 1000000001 |
| 00000011 | 00000000 | 00000000 | 11111100 | | 1000000011 |
| 00000111 | 00000000 | 00000000 | 11111000 | | 1000000111 |
| 00001111 | 00000000 | 00000000 | 11110000 | | 1000001111 |
| 00011111 | 00000000 | 00000000 | 11100000 | | 1000011111 |
| 00111111 | 00000000 | 00000000 | 11000000 | | 1000111111 |
| 01111111 | 00000000 | 00000000 | 10000000 | | 1001111111 |
| 11111111 | 00000000 | 00000000 | 00000000 | 270° | 1011111111 |
| 01111111 | 10000000 | 00000000 | 00000000 | | 0010000000 |
| 00111111 | 11000000 | 00000000 | 00000000 | | 0011000000 |

TABLE 1-continued comparing novel phase interpolator scheme to prior art

| | prior art scheme | | | output phase | NOVEL SCHEME |
|---|---|---|---|---|---|
| pictrl1<31:24> | pictrl1<23:16> | pictrl1<15:8> | pictrl1<7:0> | | pictrl2<9:0> |
| 00011111 | 11100000 | 00000000 | 00000000 | | 0011100000 |
| 00001111 | 11110000 | 00000000 | 00000000 | | 0011110000 |
| 00000111 | 11111000 | 00000000 | 00000000 | | 0011111000 |
| 00000011 | 11111100 | 00000000 | 00000000 | | 0011111100 |
| 00000001 | 11111110 | 00000000 | 00000000 | | 0011111110 |
| 00000000 | 11111111 | 00000000 | 00000000 | 180° | 0011111111 |
| 00000000 | 01111111 | 10000000 | 00000000 | | 0110000000 |
| 00000000 | 00111111 | 11000000 | 00000000 | | 0111000000 |
| 00000000 | 00011111 | 11100000 | 00000000 | | 0111100000 |
| 00000000 | 00001111 | 11110000 | 00000000 | | 0111110000 |
| 00000000 | 00000111 | 11111000 | 00000000 | | 0111111000 |
| 00000000 | 00000011 | 11111100 | 00000000 | | 0111111100 |
| 00000000 | 00000001 | 11111110 | 00000000 | | 0111111110 |
| 00000000 | 00000000 | 11111111 | 00000000 | 90° | 0111111111 |
| 00000000 | 00000000 | 01111111 | 10000000 | | 1110000000 |
| 00000000 | 00000000 | 00111111 | 11000000 | | 1111000000 |
| 00000000 | 00000000 | 00011111 | 11100000 | | 1111100000 |
| 00000000 | 00000000 | 00001111 | 11110000 | | 1111110000 |
| 00000000 | 00000000 | 00000111 | 11111000 | | 1111111000 |
| 00000000 | 00000000 | 00000011 | 11111100 | | 1111111100 |
| 00000000 | 00000000 | 00000001 | 11111110 | | 1111111110 |
| 00000000 | 00000000 | 00000000 | 11111111 | 0° | 1111111111 |

Figure 5:
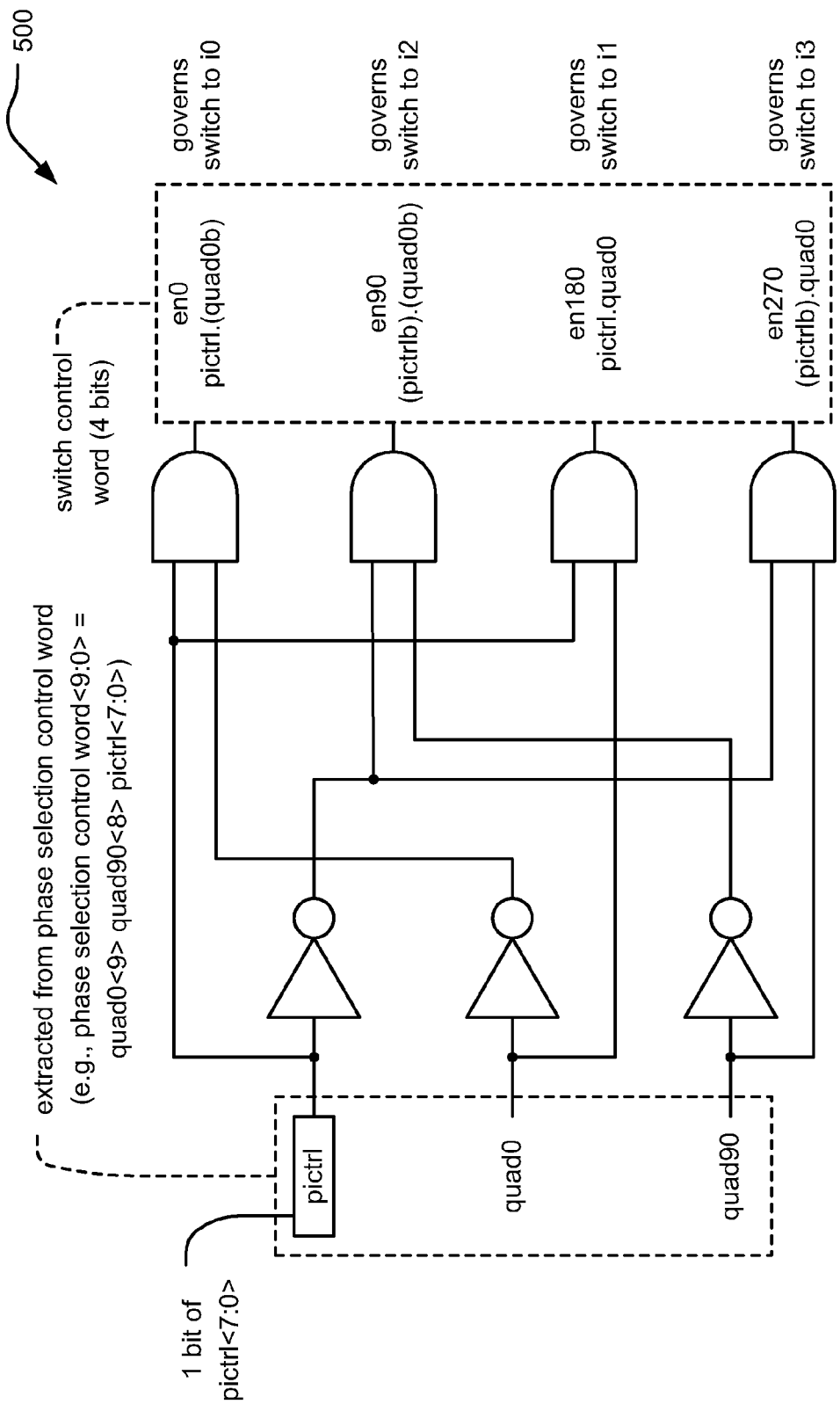
FIG. 5 illustrates an embodiment of a decoder implemented to process a phase selection control word to generate at least one switch control word.

FIG. 5 illustrates an embodiment of a decoder 500 implemented to process a phase selection control word to generate at least one switch control word. This diagram shows the implementation of the decoder 500 used to ensure glitch-less operation.

Each phase selection control word includes phase interpolating bits (pictrl) and quadrant indicating bits (quad0 and quad90). In this embodiment, the phase selection control word is shown as including 10 bits (e.g., 2 quadrant indicating bits (quad0 and quad90) and 8 phase interpolating bits (pictrl)). However, it is noted that a larger or smaller sized control word can alternatively be employed as well without departing from the scope and spirit of the invention.

This diagram depicts phase interpolating bits pictrl<7:0> (din<7:0>), and 2 quadrant indicating bits, 2 quad bits <9:8> (quad0 and quad90). The phase selection control word undergoes processing in the decoder as depicted to a switch control signal that includes 4 individual control signals or bits that controls the individual switches of a switching circuit coupled to a corresponding digital to analog converter (DAC) current source/supply used in phase interpolator (PI).

The size of such a decoder 500 can be relatively very small, and each such instantiation of the decoder 500 can be incorporated in its corresponding switched DAC current source/supply.

For fixed quadrant indicating bits, 2 quad bits <9:8>(quad0 and quad90), changing the value of the phase interpolating bits pictrl<7:0>(din<7:0>) changes only one bit, and no glitch is thereby produced.

Similarly, it can also be seen that for all combinations of phase selection control words, pictrl2<9:0> as depicted in the Table 1, no glitch is produced in the output phase.

As can be seen in the diagram, each individual bit of the switch control word controls one of the switches to direct current from the corresponding switched DAC current source/supply to one of the differential pairs of transistors whose gates receive one of the clock signals having phase 0°, 90°, 180°, or 270°.

Figure 6:
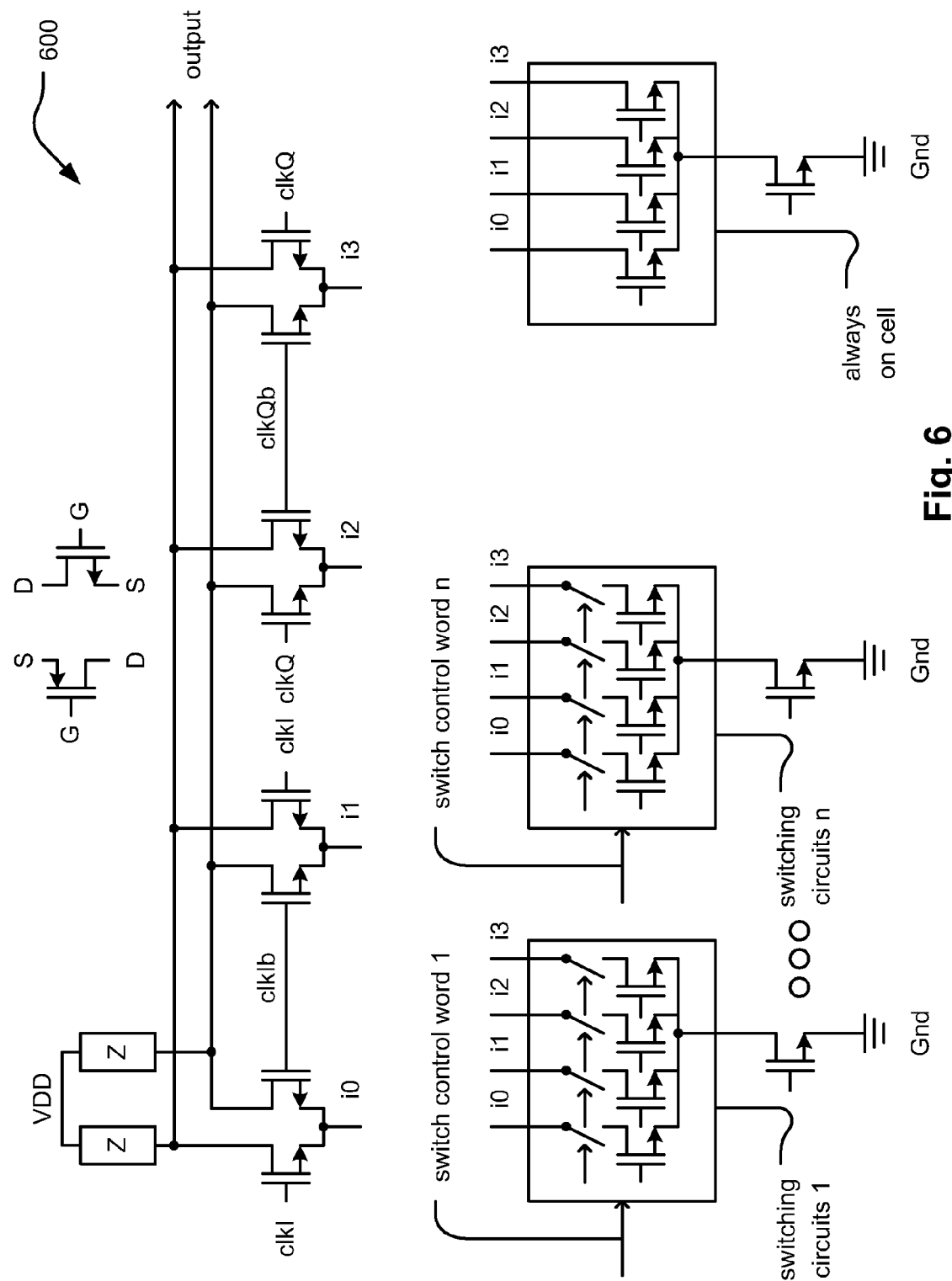
FIG. 6 illustrates an alternative embodiment of a phase interpolator with one always on cell.

FIG. 6 illustrates an alternative embodiment of a phase interpolator 600 with one always on cell. This diagram shows an embodiment that consists of 4 switched differential pairs of transistors with a common load (shown in this embodiment generally as impedances Z coupled from the coupled drains of the differential pairs of transistors to a power supply voltage, e.g., VDD).

These load impedances, Z (e.g., which can be resistors, inductors, capacitors, transistors, other circuit elements, and/or any combination thereof) may be coupled between the coupled drains of the differential pairs of transistors to a power supply voltage (e.g., VDD or VSS).

The phase of the output signal is controlled by a current steering DAC which employs n switched cells, where n is an integer. The example of n=64 may be considered as one embodiment for illustration. Usually the 64 steering DAC cells are not uniform, and their relative sizing is optimized for the most linear relationship between digital control code and rotator phase output.

To reduce the nonlinearity in phase steps, the size of the bias transistor in each DAC cell must be finely tuned during simulation. Some of the drawbacks of using non-identical sized DAC cells are an increased layout area and mismatches inherently resulting there from.

To combat these and other problematic issues, at least one always on cell is employed such that each of the differential pairs of transistors has at least some current being providing to it. This way, continuous current is provided to certain elements within the overall architecture. The implementation of always on current supplies ensures that these differential pairs of transistors have improved linearity, reduced/faster settling time (e.g., operates faster since always on), and generally provide improved accuracy and a better phase response time of the PIs. By providing this current bias to the selected components, the need for charging up and turning on that component is obviated thereby ensuring much faster operation. The always on digital-to-analog (DAC) current cells provide for improved linearity and phase change response time of the PI.

As can be seen, this implementation of using at least one always on DAC cell obviates the need for attempting or requiring the use of more uniform DAC cells. Also, it can be seen that the always on DAC cell is not switched by a corresponding switch control word, in that, it is always on thereby always providing current to the corresponding differential pairs of transistors.

Considering the switch control word 1, that is provided to control the switches of the switching circuit 1, current will be directed from the current supply coupled to the switching circuit 1 via path i0, i1, i2, or i3, to one of the differential pairs of transistors (i.e., to the differential pair that gets current i0, the differential pair that gets current i1, differential pair that gets current i2, or differential pair that gets current i3).

Because of the implementation of the always on cell, each of these differential pairs of transistors will always get some current provide to it thereby avoiding the charging up and turning on of the individual transistors of that differential pair thereby ensuring much faster operation.

Figure 7:
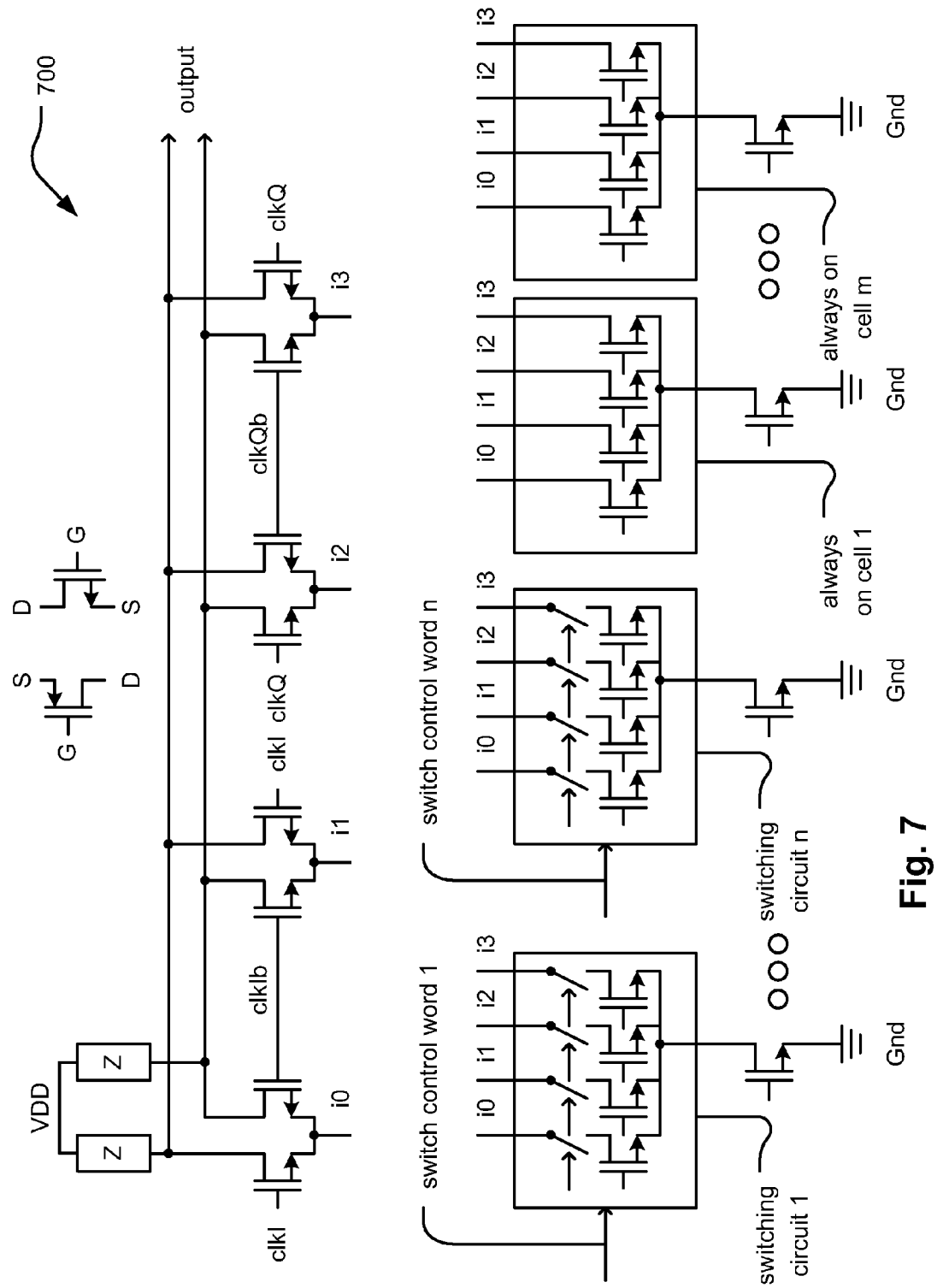
FIG. 7 illustrates an alternative embodiment of a phase interpolator with more than one always on cell.

FIG. 7 illustrates an alternative embodiment of a phase interpolator 700 with more than one always on cell. This embodiment is very analogous to the previous embodiment with at least one difference being that more than one always on DAC cell is employed (e.g., depicted as always on cell 1 up to always on cell m, where m is an integer and a design choice). In some embodiments, 3 always on cells are employed (e.g., m=3). Any desired number of always on cells can be employed without departing from the scope and spirit of the invention.

Figure 8:
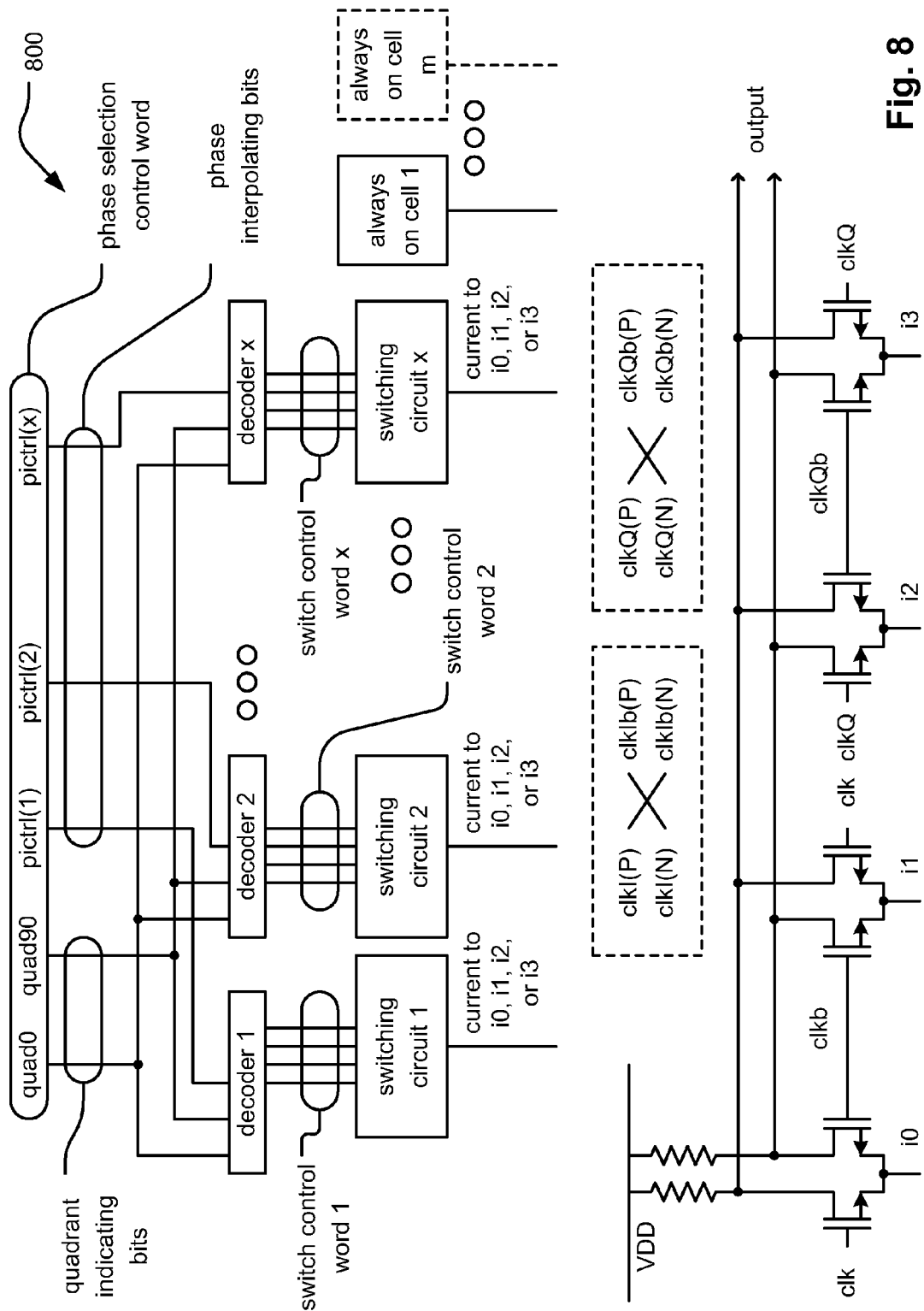
FIG. 8 illustrates an alternative embodiment of a phase interpolator.

FIG. 8 illustrates an alternative embodiment of a phase interpolator 800. A phase selection control word including 2 quadrant indicating bits and phase interpolating bits is provided to a number of decoders such that each decoder receives the 2 quadrant indicating bits and one bit of the phase interpolating bits (i.e., the one phase interpolating bit corresponding to that decoder).

It is noted that this embodiment, and other embodiments depicted herein, employs a phase selection control word includes 2 quadrant indicating bits and phase interpolating bits for a 4 clock scheme (e.g., 4 clocks having phases 0°, 90°, 180°, and 270°). Alternative embodiments can employ a phase selection control word could includes 3 sector indicating bits and phase interpolating bits for an 8 clock scheme (e.g., 8 clocks having phases 0°, 45°, 90°, 135°, 180°, 225°, 270°, and 315°). Generally speaking, depending on the number of clock signal employed in a particular scheme, $2^m$, then m sector indicating bits are employed within the phase selection control word.

For example, for a range between 0° and 360° being divided into $2^m$ sectors, then m sector indicating bits are employed. This is assuming the range between 0° and 360° is divided evenly such that each sector covers a same number of degrees. Some particular examples are shown below.

a. for the range between 0° and 360° being divided into $4=2^2$ sectors, then 2 sector indicating bits are employed to indicate the sectors/quadrants of 0° to 90°, 90° to 180°, 180° to 270°, and 270° to 0°/360°.

b. for the range between 0° and 360° being divided into $8=2^3$ sectors, then 3 sector indicating bits are employed to indicate the sectors of 0° to 45°, 45° to 90°, 90° to 135°, 135° to 180°, 180° to 225°, 225° to 270°, 270° to 315°, and 315° to 0°/360°.

c. for the range between 0° and 360° being divided into $16=2^4$ sectors, then 4 sector indicating bits are employed to indicate the sectors of 0° to 22.5°, 22.4° to 45°, and so on to the range between 337.5° to 0°/360°.

Moreover, it is noted that the range between 0° and 360° could alternatively be divided into any other number of sectors (e.g., 10 sectors such that each sector covers 36°, 9 sectors such that each sector covers 40°, or some other number of sectors). In even other embodiments, the range between 0° and 360° need not be uniformly divided so that greater resolution could be provided in certain sectors (e.g., those sectors covering a relatively smaller range) and less resolution could be provided in certain sectors (e.g., those sectors covering a relatively larger range).

Based on this approach, to indicate any number between 4, 8, 16, etc. sectors would employs a number of sector indicating bits the next number of $2^m$.

For example, any number of sectors between 5 and 8, inclusive, would employ 3 sector indicating bits. Any number of sectors between 9 and 16, inclusive, would employ 4 sector indicating bits. Any number of sectors between 17 and 32, inclusive, would employ 5 sector indicating bits. These principles can be extended to cover any number of sectors into which the range between 0° and 360° is divided.

Each decoder then decodes phase selection control word (that includes the sector indicating bits, which are quadrant indicating bits in this particular embodiment, and one bit of the phase interpolating bits) thereby generating a switch control word.

The corresponding switch control word then directs current from its corresponding current source/supply (e.g., the current source/supply coupled to that switching circuit) to one of the differential pairs of transistors (e.g., that receives the current i0, i1, i2, or i3).

If it also noted in this embodiment, as well as other embodiments depicted herein, that only 2 clock signals need be received in a 4 clock embodiment (e.g., that employs clock signals 0°, 90°, 180°, and 270° phases).

Generally speaking, it is noted that only one half of the needed clock signals need be received, and the remaining of the clock signals can be generated using those firstly received clock signals. For example, if only clock signals having phases 0° and 90° are received, then each of those clock signals can be inverted to generate the clock signals having phases 180° and 270°, respectively.

Considering an embodiment employing differential clock signals, the polarity of a differential clock signal having phase 0° needs only to be switched to generate a differential clock signal having phase 180°. Also, the polarity of a differential clock signal having phase 90° needs only to be switched to generate a differential clock signal having phase 270°.

Figure 9:
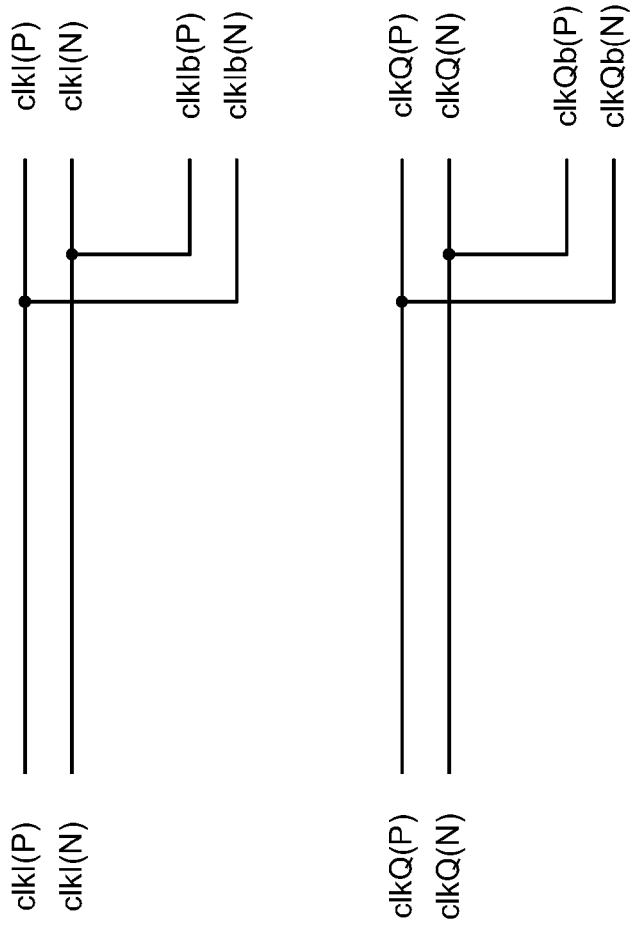
FIG. 9 and FIG. 10 illustrate alternative embodiments of clock processing modules.
Figure 10:
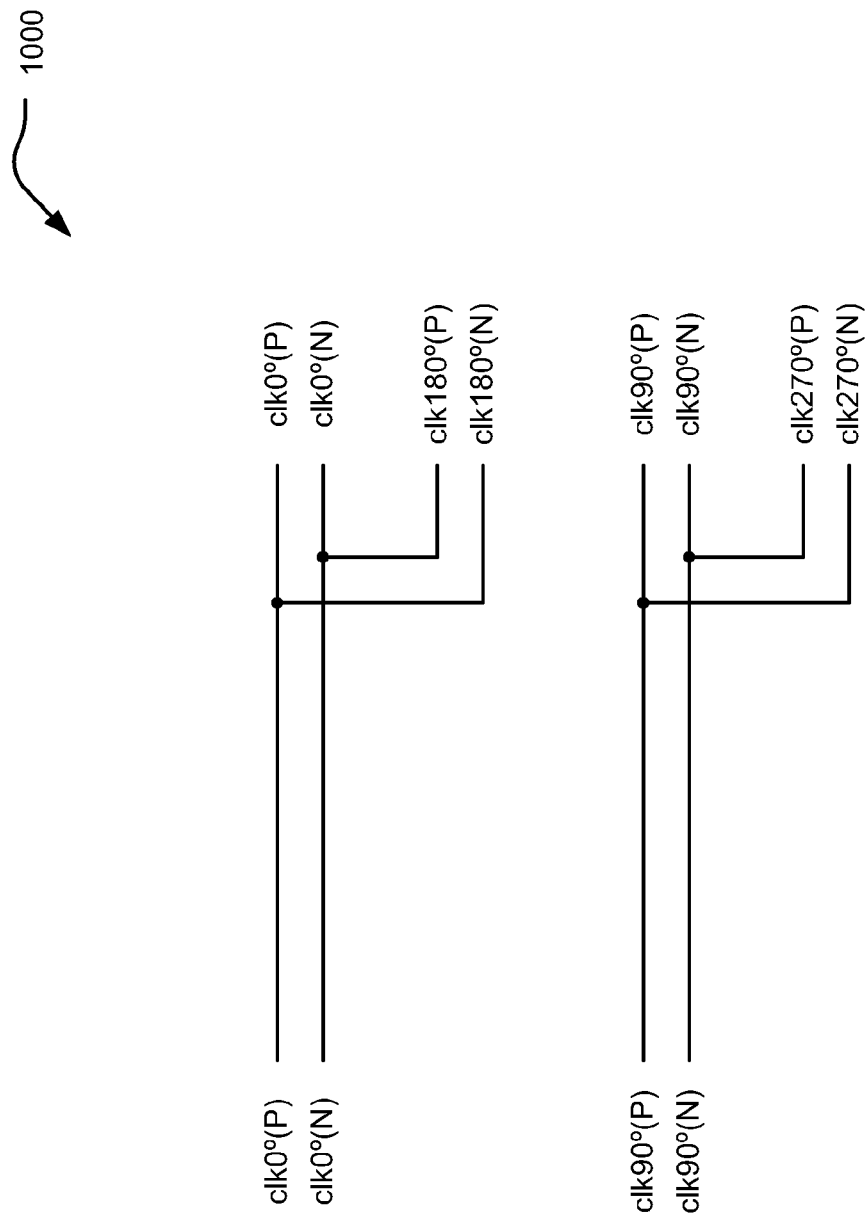

FIG. 9 and FIG. 10 illustrate alternative embodiments 900 and 1000 of clock processing modules.

Referring to the embodiment 900 of FIG. 9, as can be seen, when processing differential clock signal clkI, its polarity only need be switched to generate differential clock signal clkIb, or vice versa. When processing differential clock signal clkQ, its polarity only need be switched to generate differential clock signal clkQb, or vice versa.

Referring to the embodiment 1000 of FIG. 10, as can be seen, when processing a differential clock signal having phase 0°, its polarity only need be switched to generate a differential clock signal having phase 180°, or vice versa. When processing a differential clock signal having phase 90°, its polarity only need be switched to generate a differential clock signal having phase 270°, or vice versa.

Again, generally speaking, depending on the number of clocks being employed in a particular embodiment (and assuming the range between 0° and 360° is uniformly divided), then only one half of clock signals need be received. For example, if the range between 0° and 360° is divided into 8 sectors, then a clock signal having phase 45° can simply be inverted to generate a clock signal having a phase of 225°, or vice versa. Analogously, a clock signal having phase 135° can simply be inverted to generate a clock signal having a phase of 315°, or vice versa. Again, when considering differential clock signals, a polarity of a clock signal having phase 45° can simply be switched to generate a clock signal having a phase of 225°, or vice versa; and a polarity of a clock signal having phase 135° can simply be switched to generate a clock signal having a phase of 315°, or vice versa.

This embodiment also includes a number of always on cells (e.g., any number between 1 and m) to ensure that each of these differential pairs of transistors will always get some current provide to it thereby avoiding the charging up and turning on of the individual transistors of that differential pair thereby ensuring much faster operation. Again, any desired number of always on cells can be employed without departing from the scope and spirit of the invention. An output signal is provided from the connected drains of the differential pairs of transistors as shown in the bottom portion of the diagram.

FIG. 11A, FIG. 11B, FIG. 11C, and FIG. 11D illustrate embodiments 1101, 1102, 1103, and 1104, respectively, of output currents from switching circuits to generate output signals having various phases.

In each of these embodiments 1101, 1102, 1103, and 1104, the current indicated by i0 is provided to differential pair that receives clock signal having phase 0°, the current indicated by i2 is provided to differential pair that receives clock signal having phase 90°, the current indicated by i1 is provided to differential pair that receives clock signal having phase 180°, and the current indicated by i3 is provided to differential pair that receives clock signal having phase 270°.

Any desired phase can be generated (within the constraints of the step size of the phase interpolator) by provided current to one differential pair or a combination of two selected differential pairs of transistors.

Figure 11A:
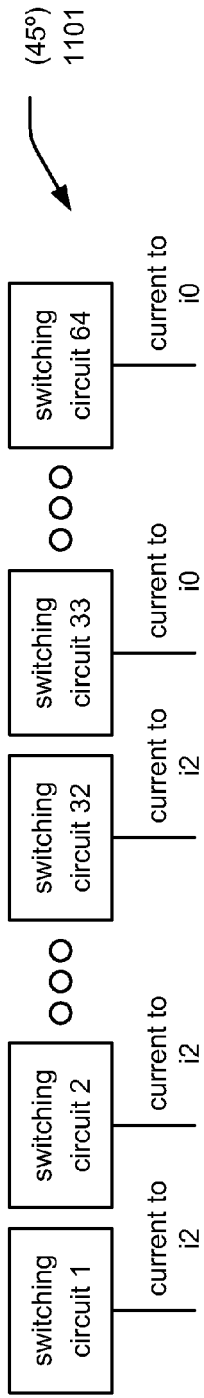
FIG. 11A, FIG. 11B, FIG. 11C, and FIG. 11D illustrate embodiments of output currents from switching circuits to generate output signals having various phases.
Figure 11B:
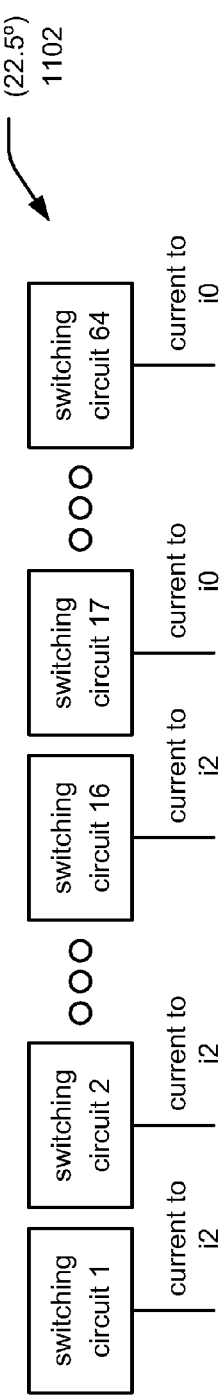
Figure 11D:
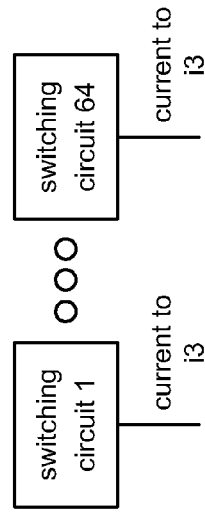
Figure 11C:
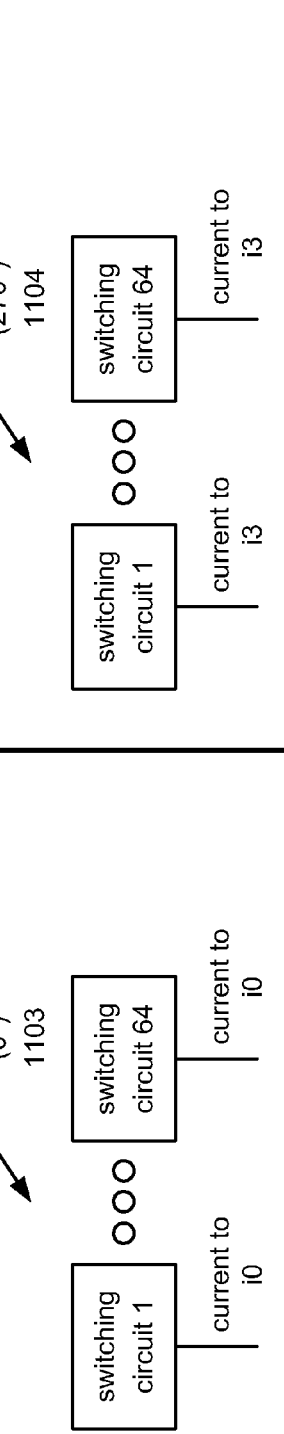

For example, referring to embodiment 1103 of FIG. 11C that considers an embodiment having 64 current sources and 64 corresponding switching circuits, if all current from all of the current supplies/sources is directed to the differential pair whose gates receive the clock signal having phase 0° (e.g., via path i0), then the output signal has a phase of 0°.

If all current from all of the current supplies/sources is directed to the differential pair whose gates receive the clock signal having phase 90° (e.g., via path i2), then the output signal has a phase of 90°.

If all current from all of the current supplies/sources is directed to the differential pair whose gates receive the clock signal having phase 180° (e.g., via path i1), then the output signal has a phase of 180°.

For example, referring to embodiment 1104 of FIG. 11D that considers such an embodiment having 64 current sources and 64 corresponding switching circuits, if all current from all of the current supplies/sources is directed to the differential pair whose gates receive the clock signal having phase 270° (e.g., via path i2), then the output signal has a phase of 270°.

Alternatively, if any phase between any two clock signals is desired, then the current can be appropriately divided between those two corresponding differential pairs of transistors.

For example, referring to embodiment 1101 of FIG. 11A that considers an embodiment having 64 current sources and 64 corresponding switching circuits, if the current from one half of the current sources (e.g., 33 to 64) is directed to the differential pair whose gates receive the clock signal having phase 0° (e.g., via path i0), and if the current from one half of the current sources (e.g., 1 to 32) is directed to the differential pair whose gates receive the clock signal having phase 90° (e.g., via path i2), then the output signal has a phase of 45°.

As another example, referring to embodiment 1102 of FIG. 11B that considers an embodiment having 64 current sources and 64 corresponding switching circuits, if the current from three fourths of the current sources (e.g., 17 to 48) is directed to the differential pair whose gates receive the clock signal having phase 0° (e.g., via path i0), and if the current from one fourth of the current sources (e.g., 1 to 16) is directed to the differential pair whose gates receive the clock signal having phase 90° (e.g., via path i2), then the output signal has a phase of 22.5°.

Depending on the appropriate directing of current from a first selected number of current supplies to one differential pair and the appropriate directing of current from a second selected number of current supplies to another differential pair, then an output signal having any desired phase can be generated (within the constraints of the step size of the phase interpolator).

FIG. 12 illustrates an embodiment of a method 1200 for generated a phase interpolated signal. The method 1200 begins by receiving a phase selection control word that includes 2 quadrant indicating bits and interpolating bits, as shown in a block 1210.

The operations within blocks 1210*a* and 1210*b* may be performed simultaneously and/or in parallel with one another. The method 1200 continues by decoding the 2 quadrant indicating bits and a first interpolating bit thereby generating a first switch control word, as shown in a block 1220*a*. Simultaneously and/or in parallel operation, the method 1200 continues by decoding the 2 quadrant indicating bits and a second interpolating bit thereby generating a second switch control word, as shown in a block 1220*b*.

The operations within blocks 1220*a* and 1220*b* may be performed simultaneously and/or in parallel with one another. The method 1200 continues by employing the first switch control word to direct current to first selected differential pair of transistors whose gates receive first clock signal, as shown in a block 1230*a*. Simultaneously and/or in parallel operation, the method 1200 continues by employing the second switch control word to direct current to second selected differential pair of transistors whose gates receive second clock signal, as shown in a block 1230*b*.

The method 1200 continues by outputting a signal from the coupled drains of the differential pairs of transistors, as shown in a block 1240.

It is noted that the various modules (e.g., encoders, decoders, switching circuits, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. An apparatus, comprising:
a plurality of differential pairs of transistors such that gates of each differential pair of transistors for receiving a respective differential input clock signal, sources of each differential pair of transistors connected, and drains of each differential pair of transistors for outputting a differential output clock signal;
a plurality of switches for selectively enabling a plurality of current supplies to supply current respectively to connected sources of at least one selected transistor of the plurality of differential transistors based on a plurality of control words such that each of the plurality of switch control words corresponding to one of the plurality of switches, wherein each of the plurality of switch control words being respectively generated from 2 quadrant indicating bits and one respective phase interpolating bit; and
at least one additional current supply for continuously supplying at least one additional current to connected sources of at least one of the plurality of differential transistors.

2. The apparatus of claim 1, wherein:
the plurality of switch control words including a first switch control word and a second switch control word; and further comprising:
a plurality of decoders for:
processing the 2 quadrant indicating bits and a first phase interpolating bit thereby generating the first switch control word; and
processing the 2 quadrant indicating bits and a second phase interpolating bit thereby generating the second switch control word.

3. The apparatus of claim 2, wherein:
a plurality of phase interpolating bits including N bits including the first phase interpolating bit and the second first phase interpolating bit;
the plurality of decoders including N decoders; and
each decoder of the N decoders respectively processing only one bit of the N bits of the plurality of phase interpolating bits.

4. The apparatus of claim 1, wherein:
a first subset of the plurality of switches selectively enabling a first current supply to supply first current respectively to connected sources of a first at least one selected transistor of the plurality of differential transistors based on a first switch control word; and
a second subset of the plurality of switches selectively enabling a second current supply to supply second current respectively to connected sources of a second at least one selected transistor of the plurality of differential transistors based on a second switch control word.

5. The apparatus of claim 1, further comprising:
a plurality of switching circuits including the plurality of switches; and wherein:
the plurality of differential pairs of transistors including 4 differential pairs of transistors;
each of the plurality of switching circuits respectively including 4 switches;
each one of the 4 respective switches within each respective switching circuit connected respectively to connected sources of one of the 4 differential pairs of transistors.

6. The apparatus of claim 1, wherein:
first respective drains of each differential pair of transistors connected for outputting a first leg of the differential output clock signal; and
second respective drains of each differential pair of transistors connected for outputting a second leg of the differential output clock signal.

7. The apparatus of claim 1, wherein:
the plurality of differential pairs of transistors including 4 differential pairs of transistors;
gates of a first of the 4 differential pairs of transistors receiving a first differential input clock signal;
gates of a second of the 4 differential pairs of transistors receiving a second differential input clock signal;
gates of a third of the 4 differential pairs of transistors receiving a third differential input clock signal; and
gates of a fourth of the 4 differential pairs of transistors receiving a fourth differential input clock signal.

8. The apparatus of claim 7, wherein:
the third differential input clock signal generated by switching a polarity of the first differential input clock signal; and
the fourth differential input clock signal generated by switching a polarity of the second differential input clock signal.

9. The apparatus of claim 1, wherein:
the plurality of switch control words including a first switch control word and a second switch control word; and
each of the first switch control word and the second switch control word including a same number of bits.

10. The apparatus of claim 1, wherein:
the apparatus being a communication device; and
the communication device being operative within at least one of a satellite communication system, a wireless communication system, a wired communication system, and a fiber-optic communication system.

11. An apparatus, comprising:
a plurality of differential pairs of transistors such that gates of each differential pair of transistors for receiving a respective differential input clock signal, sources of each differential pair of transistors connected, and drains of each differential pair of transistors for outputting a differential output clock signal;
a first plurality of switches for selectively enabling a first current supply to supply first current respectively to connected sources of a first at least one selected transistor of the plurality of differential transistors based on a first switch control word based on 2 quadrant indicating bits and a first phase interpolating bit;
a second plurality of switches for selectively enabling a second current supply to supply second current respectively to connected sources of a second at least one selected transistor of the plurality of differential transistors based on a second switch control word based on the 2 quadrant indicating bits and a second phase interpolating bit; and
a third current supply for continuously supplying third current to connected sources of at least one of the plurality of differential transistors.

12. The apparatus of claim 11, further comprising:
a plurality of decoders for:
processing the 2 quadrant indicating bits and a first phase interpolating bit thereby generating the first switch control word; and
processing the 2 quadrant indicating bits and a second phase interpolating bit thereby generating the second switch control word.

13. The apparatus of claim 12, wherein:
a plurality of phase interpolating bits including N bits including the first phase interpolating bit and the second first phase interpolating bit;
the plurality of decoders including N decoders; and
each decoder of the N decoders respectively processing only one bit of the N bits of the plurality of phase interpolating bits.

14. The apparatus of claim 11, further comprising:
a plurality of switching circuits including the plurality of switches; and wherein:
the plurality of differential pairs of transistors including 4 differential pairs of transistors;
each of the plurality of switching circuits respectively including 4 switches;
each one of the 4 respective switches within each respective switching circuit connected respectively to connected sources of one of the 4 differential pairs of transistors.

15. The apparatus of claim 11, wherein:
first respective drains of each differential pair of transistors connected for outputting a first leg of the differential output clock signal; and
second respective drains of each differential pair of transistors connected for outputting a second leg of the differential output clock signal.

16. The apparatus of claim 11, wherein:
the plurality of differential pairs of transistors including 4 differential pairs of transistors;
gates of a first of the 4 differential pairs of transistors receiving a first differential input clock signal;
gates of a second of the 4 differential pairs of transistors receiving a second differential input clock signal;
gates of a third of the 4 differential pairs of transistors receiving a third differential input clock signal; and
gates of a fourth of the 4 differential pairs of transistors receiving a fourth differential input clock signal.

17. An apparatus, comprising:
a plurality of decoders for:
processing 2 quadrant indicating bits and a first phase interpolating bit thereby generating a first switch control word; and
processing the 2 quadrant indicating bits and a second phase interpolating bit thereby generating a second switch control word having a same number of bits as the first switch control word;
a plurality of differential pairs of transistors such that gates of each differential pair of transistors for receiving a respective differential input clock signal, sources of each differential pair of transistors connected, and drains of each differential pair of transistors for outputting a differential output clock signal;
a first plurality of switches for selectively enabling a first current supply to supply first current respectively to connected sources of a first at least one selected transistor of the plurality of differential transistors based on the first switch control word;
a second plurality of switches for selectively enabling a second current supply to supply second current respectively to connected sources of a second at least one selected transistor of the plurality of differential transistors based on the second switch control word; and
a third current supply for continuously supplying third current to connected sources of at least one of the plurality of differential transistors.

18. The apparatus of claim 17, wherein:
a plurality of phase interpolating bits including N bits including the first phase interpolating bit and the second first phase interpolating bit;
the plurality of decoders including N decoders; and
each decoder of the N decoders respectively processing only one bit of the N bits of the plurality of phase interpolating bits.

19. The apparatus of claim 17, wherein:
the plurality of differential pairs of transistors including 4 differential pairs of transistors;
gates of a first of the 4 differential pairs of transistors receiving a first differential input clock signal;
gates of a second of the 4 differential pairs of transistors receiving a second differential input clock signal;
gates of a third of the 4 differential pairs of transistors receiving a third differential input clock signal; and
gates of a fourth of the 4 differential pairs of transistors receiving a fourth differential input clock signal.

20. The apparatus of claim 19, wherein:
the third differential input clock signal generated by switching a polarity of the first differential input clock signal; and
the fourth differential input clock signal generated by switching a polarity of the second differential input clock signal.

* * * * *